United States Patent [19]

Mazin et al.

[11] Patent Number: 4,521,695
[45] Date of Patent: Jun. 4, 1985

[54] CMOS D-TYPE LATCH EMPLOYING SIX TRANSISTORS AND FOUR DIODES

[75] Inventors: Moshe Mazin; William E. Engeler, both of Scotia, N.Y.

[73] Assignee: General Electric Company, Schenectady, N.Y.

[21] Appl. No.: 478,014

[22] Filed: Mar. 23, 1983

[51] Int. Cl.³ .................. H03K 3/356; H03K 19/096; H03K 23/22; G11C 19/28
[52] U.S. Cl. .................. 307/279; 307/272 A; 307/452; 307/481; 377/105; 377/117
[58] Field of Search .............. 307/452, 481, 576, 579, 307/585, 272 A, 288; 377/115–117, 105, 127, 68, 79

[56] References Cited

U.S. PATENT DOCUMENTS

| | | | |
|---|---|---|---|
| 3,716,723 | 2/1973 | Heuner et al. | 307/221 |
| 3,716,724 | 2/1973 | Parrish et al. | 307/221 |
| 3,808,462 | 4/1974 | Parrish et al. | 307/452 X |
| 3,887,822 | 6/1975 | Suzuki | 307/452 X |
| 4,114,049 | 9/1978 | Suzuki | 307/279 X |
| 4,275,316 | 6/1981 | Knapp | 307/279 |
| 4,484,087 | 11/1984 | Mazin et al. | 377/68 X |

OTHER PUBLICATIONS

RCA Datasheet, CD4042A Type "COS/MOS Quad Clocked 'D' Latch".
RCA Datasheet, CD4013A Type "Dual 'D'-Type Flip-Flop".
RCA Datasheet, CD4015A Type "COS/MOS Dual 4-Stage Static Shift Register".
CD4006A Type and CD4006B Type "COS/MOS 18-Stage Static Shift Register".

*Primary Examiner*—Stanley D. Miller
*Assistant Examiner*—David R. Bertelson
*Attorney, Agent, or Firm*—Julius J. Zaskalicky; James C. Davis, Jr.; Marvin Snyder

[57] ABSTRACT

A D-type latch circuit employing only six insulated-gate field-effect transistors and four diodes includes three CMOS inverters, the first and third of which are modified inverters capable of being selectively enabled or disabled depending upon the sense of the supply voltage polarity applied thereto. To accomplish this, each of the first and third inverters includes a pair of isolation diodes. Voltage supply nodes of the second inverter are connected to latch voltage supply nodes for continuously enabling the second inverter. However, the voltage supply nodes of the first and second inverters are connected to a pair of complementary clock input nodes in a manner such that, when the clock input nodes have applied thereto one set of complementary logic voltage levels for enabling the latch, the first inverter is enabled and the third inverter is disabled, and when the clock input nodes have applied thereto a complementary set of logic voltage levels for not enabling the latch, the first inverter is disabled and the third inverter is enabled. In the overall configuration, the input node of the first inverter is connected to the data input node of the overall latch, and the output node of the first inverter is connected to the complementary data output node ($\overline{Q}$) of the overall latch, and also to the input node of the second inverter. The output node of the second inverter is connected to the latch data output node (Q) of the overall latch. Finally, the third inverter is cross-coupled with the second inverter in a latching configuration. In particular, the input of the third inverter is connected to the output of the second inverter, and the input of the second inverter is connected to the output of the third inverter.

5 Claims, 3 Drawing Figures

CMOS D-TYPE LATCH EMPLOYING SIX TRANSISTORS AND FOUR DIODES

BACKGROUND OF THE INVENTION

The present invention relates generally to logic circuits of the type fabricated on a monolithic semiconductor chip employing insulated-gate field-effect transistors (IGFETs) and, more particularly, to a D-type latch which can be fabricated employing complementary metal-oxide-semiconductor (CMOS) transistor technology.

As is known, a D-type latch is a form of latch useful in digital logic applications. A D-type latch has a single data input (D input), a pair of complementary data outputs (Q and $\overline{Q}$), and a clock input, which is also referred to in the art as an enable input. In operation, when the latch is enabled (for example, with the clock or enable input at a logic "high" level, also known as binary "1"), data in the form of a logic level present at the data input (D input) is transferred to the data output (Q output), with complementary data available at the complementary data output ($\overline{Q}$). So long as the latch remains enabled (with the clock or enable input high in this example), the Q and $\overline{Q}$ outputs follow the data input, with the $\overline{Q}$ output always being the complement of the Q output. When the clock or enable input transitions to the state where the latch is not enabled (in this example, a clock high to low transition), the logic level present at the input just prior to the clock transition is retained, regardless of subsequent changes in the data input, until such time as the latch is again enabled.

Typically, a plurality of such latches are included in a single integrated circuit. In one form, such latches are available in packages of, for example, four latch circuits formed on a monolithic silicon semiconductor chip and included in a single integrated circuit package. An example of such an integrated circuit, commercially available, is an RCA Type No. CD4042 "COS/MOS Quad Clocked D Latch". In another form, such latches may be included as but a small part of a much larger integrated circuit (e.g. large scale integration), in combination with either a variety of other types of digital logic elements and circuits comprising a functional device, or in combination with a multiplicity of other D-type latches comprising a D-type latch array organized much like a semiconductor memory array.

In either case, the integrated circuit typically includes a number of other elements supporting the latch circuit. These other elements include at least voltage supply lines or nodes. Also, typical D-type latch circuits require complementary clock inputs (e.g. CLK and $\overline{CLK}$), and an inverter will typically be included, common to a number of individual D-type latch circuits, to provide the complementary CLK and $\overline{CLK}$ signals.

In one common circuit application, D-type latches are arranged in pairs to respectively comprise the master section and the slave section of an edge-triggered D-type flip-flop, useful either as an individual digital logic circuit element, or connected in series with a plurality of other edge-triggered D-type flip-flops to form a clocked shift register. In an edge-triggered D-type flip-flop, the master section and the slave section are connected in series, with the clock inputs oppositely connected such that one latch section is enabled while the other is disabled, and vice-versa. Typically, for a logic low clock input, the master section is enabled and input data enters the master section. When the clock input goes high, the master section is disabled, isolating the flip-flop input, and the slave section is enabled, allowing data to be transferred from the master section to the slave section, and thus to the flip-flop output An example of a commercially available edge-triggered D-type flip-flop including a pair of D-type latches in a master/slave configuration is an RCA Type No. CD4013 "Dual 'D'-Type Flip-Flop". Examples of commercially-available static shift registers including a plurality of D-type flip-flops as individual stages are an RCA Type No. CD4015, "COS/MOS Dual 4-Stage Static Shift Register", and an RCA Type No. CD4006 "COS/MOS 18-Stage Static Shift Register".

In the design of integrated circuits, particularly large scale integrated circuits comprising a multiplicity of individual logic elements, important considerations are minimizing the transistor count and reducing the circuit area required for each individual logic element or circuit.

Typical prior art D-type static latch circuits, when implemented in CMOS, generally comprise at least a pair of CMOS inverters cross-coupled in a latching configuration and a pair of CMOS transmission gates for selectively electrically connecting the inverter inputs and outputs to appropriate circuit nodes. The transmission gates are selectively enabled by the complementary clock inputs CLK and $\overline{CLK}$. For example, an RCA Type No. CD4042 D-type latch includes one transmission gate between the latch input and the input of one inverter, another inverter cross-coupled with the one inverter, and another transmission gate in series with the other inverter output. Since a CMOS transmission gate and a CMOS inverter each require two IGFETs, the overall latch having two inverters and two transmission gates includes at least eight transistors. Various other D-type latch circuits require larger numbers of transistors.

Also relevant in the context of the present invention are modified CMOS inverter circuits capable of being selectively enabled, such as are disclosed in Heuner et al U.S. Pat. No. 3,716,723 and Parrish et al U.S. Pat. No. 3,716,724. A standard CMOS inverter includes a P-channel IGFET having its source connected to $+V_{DD}$ and an N-channel IGFET having its source connected to ground. The two IGFET drains are connected together and to the inverter output. The two IGFET gates are connected together and to the inverter input. Thus, for a logic low input, the P-channel IGFET is turned on and pulls the output to $+V_{DD}$ (logic high), while the N-channel IGFET is off. For a logic high input, the N-channel IGFET is turned on, pulling the output to ground (logic low), while the N-channel IGFET is off. For selective enablement, the modified inverters of the above-referenced Heuner et al and Parrish et al U.S. Pat. Nos. 3,716,723 and 3,716,724 include an isolation diode connected in series with the channel of each of the IGFETs, and the inverters are powered from the CLK and $\overline{CLK}$ lines, rather than from $+V_{DD}$ and ground. For one set of CLK and $\overline{CLK}$ logic voltage levels, e.g. with CLK high and $\overline{CLK}$ low, either diode may be forward-biased, and the inverter is enabled. For a complementary set of CLK and $\overline{CLK}$ logic voltage levels, e.g. with CLK low and $\overline{CLK}$ high, both diodes are always reverse-biased, and the inverter is disabled. When such an inverter is disabled, its output impedance is quite high, to the extent that the inverter output is essentially an open circuit with respect to either logic voltage level. Such inverters capable of being selectively enabled can be configured as static and dynamic shift register stages which avoid the use of transmission gates, as is also disclosed in the above-referenced Heuner et al and Parrish et al U.S. Pat. Nos. 3,716,723 and 3,716,724.

SUMMARY OF THE INVENTION

Accordingly, it is an object of the invention to provide a D-type latch circuit having a lower transistor count than previous such circuits, and implemental in MOS integrated circuit form to achieve a higher circuit density than with prior art D-type latch circuits.

In accordance with the invention, a D-type latch circuit is provided which employs only six IGFETs, and four diodes. The diodes can be formed, employing conventional integrated circuit fabrication techniques, in a manner which results in minimal additional chip area being required for the diodes.

Briefly, in accordance with the invention, there is provided a D-type latch having a data input node (D input), data output and complementary data output nodes (Q and $\overline{Q}$), a pair of complementary clock input nodes (CLK and $\overline{\text{CLK}}$) for selectively enabling or not enabling the latch, and a pair of latch voltage supply nodes.

The latch includes three inverters which are generally of the complementary inverter type comprising both an N-channel and a P-channel IGFET, with the IGFET gates connected together and to the inverter input, the IGFET drains connected together and to the inverter output, and the IGFET source terminals connected to inverter voltage supply nodes.

The first and third inverters more particularly are modified inverters capable of being selectively enabled or disabled depending upon the sense of the supply voltage polarity applied thereto. In a preferred form, each of these first and third inverters further include a pair of unidirectional conduction elements (i.e. diodes) appropriately connected to serve as isolation diodes.

In a preferred form, each of the three inverters includes first and second conduction paths, each conduction path being connected between one of a pair of inverter voltage supply nodes and the output node of the particular inverter. Each of the paths included in the second inverter in turn includes the conduction channel of one of the transistors of the pair included in the second inverter. Each of the paths included in the first and third inverters includes the conduction channel of one of the transistors of the pair included in each of the first and third inverters in series with one of the unidirectional conduction elements. The unidirectional conduction elements of each pair are poled oppositely with respect to the output node of the particular inverter such that the particular inverter is enabled with voltage polarity of one sense applied to its voltage supply nodes permitting conduction through either unidirectional conduction element, and such that the particular inverter is disabled with the voltage polarity of the opposite sense applied to its voltage supply nodes preventing conduction through either unidirectional conduction element.

The voltage supply nodes of the second inverter are connected to the latch voltage supply nodes for continuously enabling the second inverter. However, the voltage supply nodes of the first and third inverters are connected to the complementary clock input nodes (CLK and $\overline{\text{CLK}}$) in a manner such that, when the clock input nodes have applied thereto one set of complementary logic voltage levels for enabling the latch, the first inverter is enabled and the third inverter is disabled, and when the clock input nodes have applied thereto a complementary set of logic voltage levels for not enabling the latch, the first inverter is disabled and the third inverter is enabled.

The input node of the first inverter is connected to the latch data input node, and the output node of the first inverter is connected to the latch complementary data output node ($\overline{Q}$), and also to the input node of the second inverter. The output node of the second inverter is connected to the latch data output node (Q). Finally, the third inverter is cross-coupled with the second inverter in a latching configuration. In particular, the input of the third inverter is connected to the output of the second inverter, and the input of the second inverter is connected to the output of the third inverter.

BRIEF DESCRIPTION OF THE DRAWINGS

While the novel features of the invention are set forth with particularity in the appended claims, the invention, both as to organization and content, will be better understood and appreciated, along with other objects and features thereof, from the following detailed description, taken in conjunction with the drawings, in which:

DETAILED DESCRIPTION OF THE PREFERRED EMBODIMENTS

Figure 1:
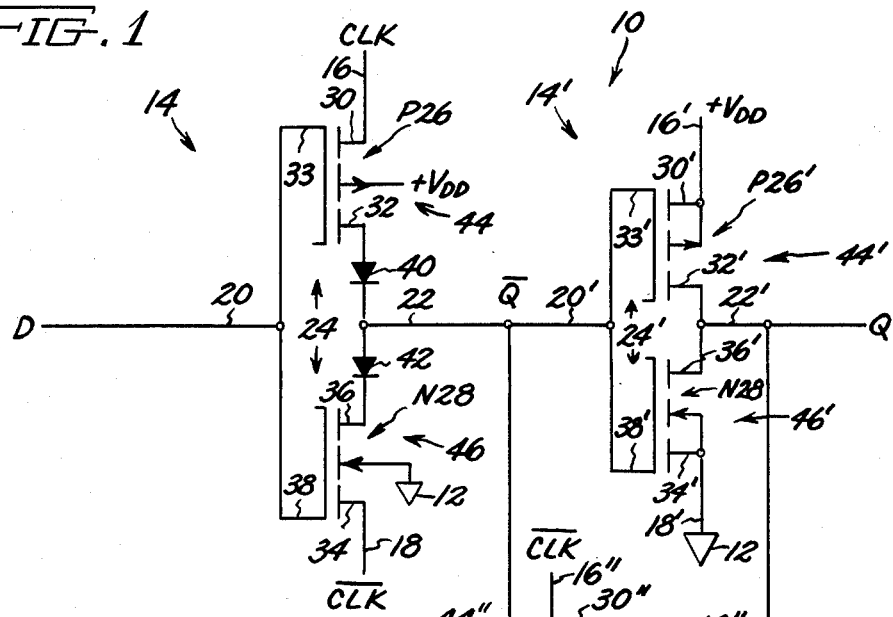
FIG. 1 is an electrical diagram of a D-type latch circuit in accordance with the invention.

It is believed that the invention, its operation and its advantages will be better understood in view of a preliminary review of the characteristics of IGFETs of the type employed in the practice of the invention. It will be appreciated that the term insulated-gate field-effect transistor (IGFET) is employed herein a generic sense to include various similar field-effect transistor devices such as metal-oxide-semiconductor field-effect transistors (MOSFETs) and metal-insulator-semiconductor field-effect transistors (MISFETs).

In the drawing FIGS., only enhancement-mode IGFETs are shown, designated in conventional fashion by means of a broken channel bar symbol. An N-channel IGFET is indicated by an arrow extending inward to the central element of the broken bar and a P-channel IGFET is indicated by an arrow extending outward from the central element of the broken bar. Also, for convenience, P-channel IGFETs are further identified by the letter P followed by a particular reference numeral, and N-channel IGFETs are further identified by the letter N followed by a particular reference numeral.

In further pertinent review, each IGFET has a pair of main terminals (source and drain) which define the ends of its conduction channel, as well as a gate electrode, the applied potential on which determines the conductivity of the conduction channel. For a P-channel IGFET, the source terminal is defined as that one of the main terminals having the more positive (higher) voltage potential applied thereto. For an N-channel IGFET, the source terminal is defined as that one of the main electrodes having the more negative (lower) voltage potential applied thereto. In either case, conduction occurs when the applied gate-to-source potential ($V_{GS}$) is both of the proper polarity to turn on the transistor, and is greater in magnitude than the threshold voltage $V_T$ of the particular transistor.

To turn on a P-channel IGFET, the gate voltage ($V_G$) must be more negative than the source voltage $V_S$ by at least $V_T$. To turn on an N-channel IGFET, $V_G$ must be more positive than $V_S$ by at least $V_T$.

As is known, complementary IGFETs (i.e. both P-channel and N-channel IGFETs) can readily be fabricated on a monolithic semiconductor chip employing conventional CMOS fabrication technology. Assuming, for purposes of example, an N⁻ (or lightly-doped N conductivity type) substrate, P-channel IGFETs are formed by diffusing P+ (or heavily-doped P conductivity type) source and drain regions spaced from each other directly into the N⁻ substrate, and providing an insulated gate electrode for inducing, by inversion, a conduction channel between the P+ source and drain terminals when a negative gate voltage is applied. The P⁻ (or lightly-doped P conductivity type) substrate required for the complementary N-channel IGFETs is obtained by diffusing one or more P⁻ well region portions into the N⁻ substrate, and then forming the N+ (or heavily-doped N conductivity type) spaced source and drain regions in the P⁻ well region portions, with gate electrodes configured for inducing, through inversion, N conductivity type conduction channels between the N+ source and drain regions.

As is further known, there are a variety of known fabrication techniques for forming diodes in CMOS integrated circuit structures, many of these techniques requiring minimal chip area. For example, a diode 40 or 42 may be formed in a P well CMOS integrated circuit process by adding an insulated P⁻ well having both P+ and N+ separate regions diffused therein. The diode so formed is between the N+ diffused region and the P⁻ well. Interconnections are made by contacting these diffused regions in the usual manner by applying the proper contact material during contact metalization Isolation of this diode is provided by the reverse bias of the diode formed by the P⁻ well and the N⁻ substrate. Care, however, should be taken to avoid injection of carriers into the bulk by the action of the vertical transistor structure formed by the diode well. A surface Schottky diode may be employed, for example, to avoid these problems.

Finally, it should be noted that in the following discussion any potential at, or near, ground is arbitrarily defined as logic "low" (or binary "0" and any potential at or near +$V_{DD}$ volts is arbitrarily defined as logic "high" (binary "1").

Referring now to the drawings in detail, FIG. 1 is an electrical schematic diagram of a D-type latch 10 which, as will be understood by those skilled in the art, may be formed on a monolithic integrated circuit chip along with either several or a multiplicity of other circuits, either other D-type latch circuits or logic circuits of other types entirely.

The latch 10 has a data input node D, a data output node Q, a complementary data output node $\overline{Q}$, a pair of complementary clock input nodes CLK and $\overline{CLK}$ for selectively enabling or not enabling the latch 10, and a pair of latch voltage supply nodes, respectively designated, for purposes of example, +$V_{DD}$ and ground 12. The latch voltage supply nodes +$V_{DD}$ and ground 12 may also be viewed as voltage supply lines of the overall integrated circuit device, of which the latch circuit 10 may well be but a small part. In the latch circuit 10, the +$V_{DD}$ potential is, for example, +5 volts with respect to the ground potential at 12.

Figure 2:
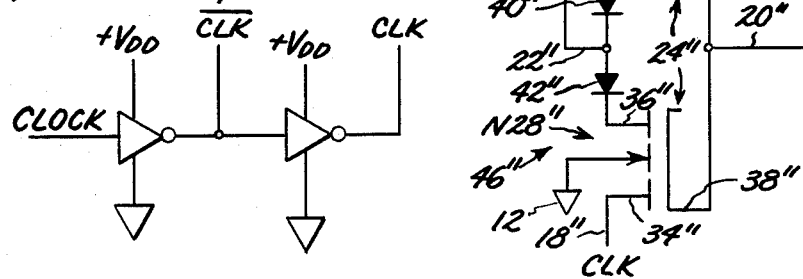
FIG. 2 is an electrical schematic block diagram representing conventional prior art practice for generating a pair of complementary clock signals suitable for driving the circuit of FIG. 1.

Referring briefly to FIG. 2, shown is a conventional circuit comprising a series-connected pair of standard CMOS inverters for deriving complementary clock signals CLK and $\overline{CLK}$ from a single CLOCK input. Thus, the clock input nodes CLK and $\overline{CLK}$ FIG. 1 may be viewed as the outputs of FIG. 2.

Referring again to FIG. 1, the particular latch 10 shown is arbitrarily configured such that the latch 10 is enabled when CLK is high and $\overline{CLK}$ is low. However, it will be appreciated that an equivalent latch 10 can be devised with the opposite operation with respect to the CLK and $\overline{CLK}$ inputs.

The latch 10 includes first, second and third inverters, respectively designated 14, 14' and 14". Each of the three inverters 14, 14' and 14" is generally of the complementary inverter type wherein the inverter input signal is applied to the gates of two IGFETs of opposite channel conductivity type with respect to each other. For power, the inverters 14, 14' and 14" have respective pairs of inverter voltage supply nodes 16 and 18, 16' and 18', and 16" and 18".

The three inverters 14, 14' and 14" have respective input nodes 20, 20' and 20", and respective output nodes 22, 22' and 22". As active elements, the three inverters 14, 14' and 14" have respective pairs 24, 24' and 24" of complementary IGFETs, i.e., P-channel IGFETs P26, P26' and P26", respectively, and N-channel IGFETs N28, N28' and N28", respectively.

The IGFETs P26, P26', P26", N28, N28' and N28" have respective conduction channels represented by broken channel bar symbols in the FIGURE, and extending between source and drain terminals of the particular transistor. The P-channel IGFETs P26, P26' and P26" have respective source terminals 30, 30' and 30", and respective drain terminals 32, 32' and 32". Respective gate electrodes 33, 33' and 33" are provided for controlling conductance of the respective channels extending between the respective source and drain terminal pairs 30 and 32, 30' and 32', and 30' and 32".

Similarly, the N-channel IGFETs N28, N28' and N28" have respective source terminals 34, 34', and 34", respective drain terminals 36, 36' and 36", and respective gate electrodes 38, 38' and 38".

Included in each of the first and third inverters 14 and 14", but not in the second inverter 14', is a pair of unidirectional conduction elements, designated 40 and 42 in the case of the first inverter 14, and designated 40" and 42" in the case of the third inverter 14".

Each of the three inverters 14, 14' and 14" may be viewed as comprising first and second conduction paths, respectively designated 44 and 46 in the case of the first inverter 14, 44' and 46' in the case of the second inverter 14', and 44" and 46" in the case of the third inverter 14". These conduction paths 44 and 46, 44' and 46', and 44" and 46" are each connected between one of the pair of inverter voltage supply nodes 16 and 18, 16' and 18', or 16" and 18" of the particular inverter and the output node of the particular inverter. For example, considering the first inverter 14, the first conduction path 44 extends between the inverter voltage supply node 16 and the output node 22, and the second conduction path 46 extends between the inverter voltage supply node 18 and the output node 22. In the second and third inverters 14' and 14", the first conduction paths 44' and 44" respectively extend between the voltage supply nodes 16' and 16" and the inverter output nodes 22' and 22", and the second conduction paths 46' and 46" respectively extend between the voltage supply nodes 18' and 18" and the inverter output nodes 22' and 22".

Within the second inverter 14' each of the conduction paths 44' and 46' comprises merely the conduction channel of one of the transistors P26' and N28' of the pair 24'. In the first and third inverters 14 and 14", each of the conduction paths 44 and 46 or 44" and 46", includes the conduction channel of one of the transistors P26 and N28, or P26" and N28" of the pair 24 or 24" in series with one of the diodes 40 and 42 or 40" and 42".

Thus, the second inverter 14' comprises what is essentially a standard CMOS inverter, while the first and third inverters 14 and 14" are modified inverters capable of being selectively enabled or disabled depending on the sense of the voltage applied to the inverter voltage supply nodes 16 and 18 or 16" and 18".

More particularly, within the first inverter 14, the first conduction path 44 thus comprises a series circuit including the channel of the transistor P26 in series with the diode 40 and extends between the voltage supply node 16 and the output node 22. The second conduction path 44 comprises a series circuit including the channel of the N-channel transistor N28 in series with the diode 42 and extends between the inverter voltage supply node 18 and the inverter output node 22. Similarly, in the third inverter 14", the first conduction path 44" comprises a series circuit including the channel of the P-channel transistor P26" in series with the diode 40" and extends between the inverter voltage supply node 16" and the inverter output node 20'. The second conduction path 46" comprises a series circuit including the channel of the N-channel transistor N28" in series with the diode 42" and extends between the inverter voltage supply node 18" and the inverter output node 22".

Significantly, the diodes 40 and 42 and 40" and 42" of each pair are poled oppositely with respect to the output node 22 or 22" of the particular inverter 14 or 14" such that the particular inverter 14 or 14" is active with voltage polarity of one sense applied to the voltage supply nodes 16 and 18 or 16" and 18" permitting conduction through either diode 40 or 42 or 40" or 42", and such that the particular inverter 14 or 14" is inactive with voltage polarity of the opposite sense applied to voltage supply nodes 16 and 18 or 16" and 18", ensuring that the diodes 40 and 42 or 40" and 42" are reverse-biased, thereby preventing conduction through either of the diodes 40 and 42 or 40" and 42".

In the particular circuit configuration illustrated, the diodes 40 and 42 or 40" and 42" are connected between the transistor drain terminals 32 and 36 or 32" and 36" and the corresponding inverter output node 22 or 22". It will be appreciated, however, that a similar result may be obtained by connecting the drain terminals 32 and 34 or 32" and 34" directly to the corresponding inverter output nodes 22 or 22", and connecting the diodes in series with the inverter voltage supply nodes 16 or 18 or 16" and 18" and the transistor source terminals 30 and 34 or 30" and 34". However, this alternative approach has the disadvantage of, during operation, reducing the effective conductance of the transistors because the diode forward voltage drop is then in series with the transistor source terminals, in effect decreasing the available gate-to-source voltage for turning on the particular transistor.

It is a feature of the subject circuit that the first and third inverters 14 and 14" are selectively and alternatively enabled or disabled depending upon the state of the CLK and $\overline{CLK}$ nodes, while the second inverter 14' remains continuously enabled. Accordingly, the inverter voltage supply nodes 16' and 18' of the second inverter 14 are directly connected to the latch voltage supply nodes $+V_{DD}$ and ground 12 for continuously powering the second inverter 16. However, the voltage supply nodes 16 and 18, and 16" and 18" of the first and third inverters 14 and 14", respectively, are connected to the complementary clock input nodes CLK and $\overline{CLK}$ in a manner such that, when the clock input nodes have applied thereto one set of complementary logic voltage levels for enabling the latch 10, e.g. CLK high and $\overline{CLK}$ low, the first inverter 14 is enabled, and the third inverter 14" is disabled. On the other hand, when the clock input node CLK and $\overline{CLK}$ have applied thereto a complementary set of logic voltage levels for not enabling the latch 10, e.g. CLK low and $\overline{CLK}$ high, the first inverter 14 is disabled and the third inverter 14" is enabled.

Considering the overall configuration of the latch 10, the input node 20 of the first inverter 14 is connected to the overall latch 10 data input node D. The output node 22 of the first inverter 14 is connected both to the overall latch 10 complementary data output node $\overline{Q}$ and to the input node 20" of the second inverter 14'. The output node 22' of the second inverter 14' is then connected to the overall latch 10 data output node Q. Finally, the third inverter 14" is cross-coupled with the second inverter 14' in a latching configuration. In particular, the input 20" of the third inverter 14" is connected to the output 22' of the second inverter 14', and the input 20' of the second inverter 14' is connected to the output 22" of the third inverter 14".

Considering the operation, when CLK is high and $\overline{CLK}$ is low, the first and second inverters 14 and 14' are enabled, while the third inverter 14" is disabled. The first inverter 14 is enabled because the source terminal 30 of the P-channel transistor P26 is positive with respect to the source 34 of the N-channel transistor N28, and either of the diodes 40 or 42 can be forward biased into conduction depending upon the state of the D input and therefore which of the transistors P26 or N28 is conducting. The second inverter 14' is enabled simply because it is connected to $+V_{DD}$ and ground so as to always be enabled.

On the other hand, the third inverter 14" is disabled because the source terminal 30" of the P-channel transistor P26" is negative with respect to the source terminal 34" of the N-channel transistor N28", and both diodes 40" and 42" are reverse-biased regardless of whether the transistors P26" and N28" are conducting or not conducting. Thus the output impedance of a disabled inverter is quite high, being determined essentially by the reverse leakage resistance of the diodes 40 and 42 or 40" and 42", to the extent that the inverter output is essentially an open circuit with respect to either logic voltage level.

Under these conditions, data in the form of a logic level at the latch 10 data input D is transferred through the first and second inverters 14 and 14' to the Q and $\overline{Q}$ outputs, and the Q and $\overline{Q}$ outputs follow the D input. In particular, the $\overline{Q}$ output, since it follows only the first inverter stage 14, is the complement of the D input. The second inverter stage 14' then provides the Q output, by complementing the $\overline{Q}$ output.

When it is desired that the latch 10 no longer be enabled, the CLK input goes low and the $\overline{CLK}$ input goes high. Under these conditions, the first inverter 14 becomes disabled, and the third inverter 14" becomes enabled. With the first inverter 14 disabled, the Q and $\overline{Q}$ outputs are isolated from the latch input D and the logic state of the latch 10 input D therefore does not affect these Q and $\overline{Q}$ outputs. However, with the third inverter 14" now active and cross-coupled to the second inverter 14', these two inverters 14' and 14" together comprise a bistable latch for maintaining the logic state at the Q and $\overline{Q}$ outputs. For example, if Q is high and $\overline{Q}$ is low, then the P-channel transistor P26' in the second inverter 14' is conducting, pulling the Q output to $+V_{DD}$. Since the input 20" of the third inverter 14" is connected to the Q output, the N-channel transistor N28" is on because its gate 38" is more positive than its source 34", which is connected to the logic low CLK node. The N-channel transistor N28" therefore pulls the inverter output node 22" and therefore the $\overline{Q}$ latch output node towards logic low through the diode 42". The P-channel transistor P26" is not conducting, because its gate 34" and source 30" terminals are at the same voltage, i.e. logic high voltage level.

In a complementary fashion, the second and third inverters 26 and 28, acting as a bistable latch, will maintain the opposite output condition, i.e. with Q low and $\overline{Q}$ high, so long as the CLK input remains low and the $\overline{CLK}$ input remains high.

At any subsequent time when the $\overline{CLK}$ input again goes high and the $\overline{CLK}$ input goes low, the latch 10 is again enabled, and the Q and $\overline{Q}$ outputs follow the D input as before.

Figure 3:
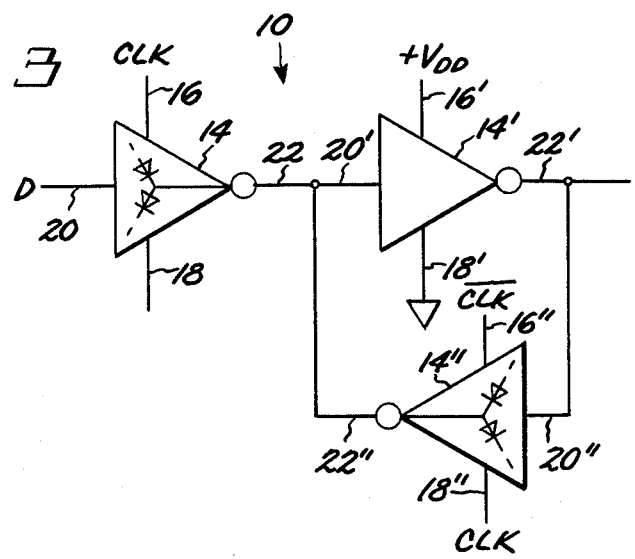
FIG. 3 is an electrical block diagram depicting the inventive circuit of FIG. 1 in more generalized form.

Referring finally to FIG. 3, shown is an electrical schematic diagram in block diagram form depicting the inverter circuit 10 in a more generalized form. In FIG. 3, the second inverter 14' comprising a standard CMOS inverter is signified by employing a standard schematic symbol for an inverter. The first and third inverters 14 and 14', which are specialized inverters capable of being selectively enabled by applying a voltage polarity of one sense to their voltage supply nodes 16 and 18 or 16" and 18", and of being selectively disabled by applying voltage polarity of the opposite sense to their voltage supply nodes 16 and 18 or 16" and 18", are represented by schematic symbols for an inverter, with the addition of the internal isolation diodes 40 and 42 or 40" and 42" connected to the respective inverter outputs 22 and 22".

As in the equivalent FIG. 1 diagram, in FIG. 3 the voltage supply nodes 16' and 18' of the second inverter 14' are also connected to the latch voltage supply nodes $+V_{DD}$ and ground 12 for continuously enabling the second inverter 14'. Likewise, the voltage supply nodes 16 and 18, or 16" and 18" of the first and third inverters 14 and 14" are connected to the complementary clock input nodes CLK and $\overline{CLK}$ in a manner such that when the clock input node CLK and $\overline{CLK}$ have applied thereto one set of complementary logic voltage levels for enabling the latch 10, the first inverter 14 is enabled and the third inverter 14" is disabled, and when the clock input node CLK and $\overline{CLK}$ have applied thereto complementary logic voltage levels, e.g. CLK low and $\overline{CLK}$ high, for not enabling the latch 10, the first inverter 14 is disabled, and the third inverter 14" is enabled so as to be actively cross-coupled with the second inverter 14' in a latching configuration.

While specific embodiments of the invention have been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. A D-type latch having a data input node, a data output node, and a complementary data output node, said latch comprising:

first, second and third inverters each having an input node, an output node, and a pair of inverter voltage supply nodes, each of said first and third inverters capable of being selectively enabled by applying voltage polarity of one sense to its voltage supply nodes and of being selectively disabled by applying voltage polarity of the opposite sense to its voltage supply nodes, the output node of either of said first and third inverters being essentially an open circuit with respect to either logic voltage level when the particular inverter is disabled;

said second inverter voltage supply nodes comprising said latch voltage supply nodes for continuously enabling said second inverter;

said first and third inverter voltage supply nodes comprising complementary clock input nodes such that, when said clock input nodes have applied thereto one set of complementary logic voltage levels for enabling said latch, said first inverter is enabled and said third is disabled, and when said clock input nodes have applied thereto a complementary set of logic voltage levels for not enabling said latch, said first inverter is disabled and said third inverter is enabled;

said first inverter input node comprising said latch data input node;

said first inverter output node comprising said latch complementary data output node and being connected to said second inverter input node;

said second inverter output node comprising said latch data output node; and said third inverter being cross-coupled with said second inverter in a latching configuration, said third inverter input node being connected to said second inverter output node and said second inverter input node being connected to said third inverter output node.

2. A D-type latch in accordance with claim 1, wherein:

said second inverter includes a complementary pair of insulated-gate field-effect transistors having gates connected in parallel and to said second inverter input node, and having respective conduction channels connected between respective ones of said pair of second inverter voltage supply nodes and said second inverter output node; and wherein:

said first and third inverters each includes a complementary pair of insulated-gate field-effect transistors having gates connected in parallel and to the respective inverter input node, and having respective conduction channels, said first and third inverters each further including a pair of unidirectional conduction devices connected in series with respective ones of said complementary pair of transistors to define a pair of series circuits, and said series circuits being connected between respective ones of said pair of inverter voltage supply nodes and said inverter output node of the respective inverter.

3. A D-type latch in accordance with claim 2, wherein said unidirectional conduction devices of said first and third inverters are each connected between each of the series-connected transistors, respectively, of the respective inverter and the inverter output node of the respective inverter.

4. A D-type latch having a data input node, a data output node, and a complementary data output node, said latch comprising first, second and third inverters each having an input node, an output node, and a pair of inverter voltage supply nodes, each of said inverters including a complementary pair of insulated-gate field effect transistors each having a conduction channel and a gate electrode for controlling the conductance of the channel, said first and third inverters each further including a pair of unidirectional conduction elements, each of said inverters including first and second conduction paths, each conduction path connected between one of the pair of inverter voltage supply nodes of the particular inverter and the output node of the particular inverter, each of said paths included in said second inverter in turn including the conduction channel of one of the transistors of the pair included in said second inverter, each of said paths included in said first and third inverters in turn including the conduction channel of one of the transistors of the pair included in each of said first and third inverters in series with one of said unidirectional conduction elements with the unidirectional conduction elements of each pair poled oppositely with respect to the output node of the particular inverter such that the particular inverter is enabled with voltage polarity of one sense applied to its voltage supply nodes permitting conduction through either unidirectional conduction element, and such that the particular inverter is disabled with voltage polarity of the opposite sense applied to its voltage supply nodes preventing conduction through either unidirectional conduction element, and the gate electrodes of each transistor pair being electrically connected to the particular inverter input node;

said second inverter voltage supply nodes comprising latch voltage supply nodes for continuously enabling said second inverter;

said first and third inverter voltage supply nodes comprising complementary clock input nodes in a manner such that, when said clock input nodes have applied thereto one set of complementary logic voltage levels for enabling said latch, said first inverter is enabled and said third inverter is disabled, and when said clock input nodes have applied thereto a complementary set of logic voltage levels for not enabling said latch, said first inverter is disabled and said third inverter is enabled;

said first inverter input node comprising said latch data input node;

said first inverter output node comprising said latch complementary data output node and being connected to said second inverter input node;

said second inverter output node comprising said latch data output node; and said third inverter being cross-coupled with said second inverter in a latching configuration, said third inverter input node being connected to said second inverter output node, and said second inverter input node being connected to said third inverter output node.

5. A D-type latch in accordance with claim 4, wherein said unidirectional conduction elements of said first and third inverters are each connected between the transistor conduction channel of each of the conduction paths, respectively, of the respective inverter and the inverter output node of the respective inverter.

* * * * *